(12) United States Patent
Fujiwara et al.

(10) Patent No.: US 11,401,384 B2
(45) Date of Patent: Aug. 2, 2022

(54) SILICOUS FILM FORMING COMPOSITION COMPRISING BLOCK COPOLYMER AND METHOD FOR PRODUCING SILICEOUS FILM USING SAME

(71) Applicant: Merck Patent GmbH, Darmstadt (DE)

(72) Inventors: Takashi Fujiwara, Kakegawa (JP); Atsuhiko Sato, Kakegawa (JP)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 17/416,005

(22) PCT Filed: Dec. 18, 2019

(86) PCT No.: PCT/EP2019/085836
§ 371 (c)(1),
(2) Date: Jun. 18, 2021

(87) PCT Pub. No.: WO2020/127413
PCT Pub. Date: Jun. 25, 2020

(65) Prior Publication Data
US 2022/0041814 A1    Feb. 10, 2022

(30) Foreign Application Priority Data

Dec. 21, 2018  (JP) .............................. JP2018-239613

(51) Int. Cl.
| | | |
|---|---|---|
| C08G 77/60 | (2006.01) | |
| C01B 33/113 | (2006.01) | |
| C09D 183/10 | (2006.01) | |
| H01L 21/02 | (2006.01) | |
| H01L 23/29 | (2006.01) | |
| C08G 77/54 | (2006.01) | |
| C08G 77/62 | (2006.01) | |
| B05D 3/04 | (2006.01) | |
| B05D 3/02 | (2006.01) | |
| C08G 77/452 | (2006.01) | |

(52) U.S. Cl.
CPC ........... *C08G 77/60* (2013.01); *B05D 3/0254* (2013.01); *B05D 3/0413* (2013.01); *C01B 33/113* (2013.01); *C08G 77/54* (2013.01); *C08G 77/62* (2013.01); *C09D 183/10* (2013.01); *H01L 21/0214* (2013.01); *H01L 21/02211* (2013.01); *H01L 21/02222* (2013.01); *H01L 21/02282* (2013.01); *H01L 21/02326* (2013.01); *H01L 21/02337* (2013.01); *H01L 23/296* (2013.01); *C08G 77/452* (2013.01)

(58) Field of Classification Search
CPC ........ C08G 77/54; C08G 77/60; B05D 3/061; B05D 3/065
USPC ......................................................... 423/335
See application file for complete search history.

(56) References Cited

U.S. PATENT DOCUMENTS

| | | |
|---|---|---|
| 2008/0305611 A1 | 12/2008 | Hirota |
| 2012/0214006 A1 | 8/2012 | Chen et al. |
| 2013/0287979 A1 | 10/2013 | Girioli et al. |
| 2016/0379817 A1* | 12/2016 | Okamura ............... C01B 21/087 438/781 |
| 2022/0009782 A1* | 1/2022 | Nakamoto ............. C08G 77/06 |

FOREIGN PATENT DOCUMENTS

| | | |
|---|---|---|
| EP | 0296028 A2 | 12/1988 |
| JP | 01-138108 A | 5/1989 |
| JP | 2013-509414 A | 3/2013 |
| JP | 2019-210370 * | 12/2019 |
| WO | 2011/053551 A1 | 5/2011 |
| WO | 2019/233838 A1 | 12/2019 |

OTHER PUBLICATIONS

Machine translation of JP 2019-210370 (no date).*
International Preliminary Report on Patentability received for PCT Patent Application No. PCT/EP2019/085836, dated Jul. 1, 2021, 10 pages.
International Search Report and Written Opinion received for PCT Patent Application No. PCT/EP2019/085836, dated Mar. 12, 2020, 12 pages.

* cited by examiner

*Primary Examiner* — Marc S Zimmer
(74) *Attorney, Agent, or Firm* — Faegre Drinker Biddle & Reath LLP

(57) ABSTRACT

According to the present invention, a siliceous film forming composition, which is capable of filling trenches having narrow widths and high aspect ratios and forming a thick film, can be provided. A siliceous film forming composition comprising: (a) a block copolymer comprising a linear and/or cyclic block A having a polysilane skeleton comprising 5 or more silicon and a block B having a polysilazane skeleton comprising 20 or more silicon, and (b) a solvent.

17 Claims, No Drawings

SILICOUS FILM FORMING COMPOSITION COMPRISING BLOCK COPOLYMER AND METHOD FOR PRODUCING SILICEOUS FILM USING SAME

CROSS-REFERENCE TO RELATED APPLICATIONS

This application is a national stage application (under 35 U.S.C. § 371) of PCT/EP2019/085836, filed Dec. 18, 2019, which claims benefit of Japanese Application No. 2018-239613, filed Dec. 21, 2018, both of which are incorporated herein by reference in their entirety.

BACKGROUND OF THE INVENTION

Technical Field

The present invention relates to a siliceous film forming composition comprising a block copolymer comprising a block having a polysilane skeleton and a block having a polysilazane skeleton, and a method for producing a siliceous film using the same.

Background Art

In the manufacture of electronic devices, especially semiconductor devices, an interlayer insulating film is formed between a transistor element and a bit line, between a bit line and a capacitor, between a capacitor and a metal wiring and between plural metal wirings, etc. Further, an insulating material is filled in an isolation trench provided on a substrate surface or the like. Furthermore, after forming a semiconductor device on a substrate surface, a coating layer is formed using a sealing material to form a package. Such an interlayer insulating film or coating layer is often formed of a siliceous material.

As a method for forming the siliceous film, a chemical vapor deposition method (CVD method), a sol-gel method, a method for coating and baking a composition comprising a silicon-containing polymer, and the like are used. Among them, a method for forming a siliceous film using a composition is often adopted, since it is relatively simple. In order to form such a siliceous film, a composition comprising a silicon-containing polymer, such as polysilazane, polysiloxane, polysiloxazane, or polysilane, is coated on a surface of substrate or the like and then baked, whereby silicon that is contained in the polymer is oxidized to form a siliceous film.

In semiconductor devices, materials that can fill trenches having narrow widths and high aspect ratios without causing defects such as voids, and that can form a high density film when baked have been always required. Furthermore, as the 3D NAND technology accelerates, it is required to be capable of forming a thicker film than before.

PRIOR ART DOCUMENTS

Patent Documents

[Patent document 1] JP 2013-509414 A

SUMMARY OF THE INVENTION

Problems to be Solved by the Invention

The present invention has been made based on the background art as described above and provides a siliceous film forming composition, which is capable of filling trenches having narrow widths and high aspect ratios and forming a thick film.

Means for Solving the Problems

The siliceous film forming composition according to the present invention comprises:
(a) a block copolymer comprising a linear and/or cyclic block A having a polysilane skeleton comprising 5 or more silicon and a block B having a polysilazane skeleton comprising 20 or more silicon, wherein at least one silicon in the block A and at least one silicon in the block B are connected by a single bond and/or a crosslinking group comprising silicon, and
(b) a solvent,
wherein the content of nitrogen in the block copolymer is 8 to 25 mass % based on the total mass of the block copolymer.

The method for producing the siliceous film according to the present invention comprises:
applying the above mentioned composition above a substrate to form a coating film, and
heating the coating film in an oxidizing atmosphere.

The method for manufacturing an electronic device according to the present invention comprises the above mentioned method for producing siliceous film.

Effects of the Invention

According to the present invention, a siliceous film forming composition, which is capable of filling trenches having narrow widths and high aspect ratios and forming a thick film, can be provided. Further, the siliceous film formed using this composition has good electrical properties.

DETAILED DESCRIPTION OF THE INVENTION

Mode for Carrying Out the Invention

Embodiments of the present invention are described below in detail. Hereinafter, symbols, units, abbreviations, and terms have the following meanings in the present specification unless otherwise specified.

In the present specification, when numerical ranges are indicated using "to", they include both end points, and the units thereof are common. For example, 5 to 25 mol % means 5 mol % or more and 25 mol % or less.

In the present specification, the hydrocarbon means one including carbon and hydrogen, and optionally including oxygen or nitrogen. The hydrocarbyl group means a monovalent or divalent or higher valent hydrocarbon.

In the present specification, the aliphatic hydrocarbon means a linear, branched or cyclic aliphatic hydrocarbon, and the aliphatic hydrocarbon group means a monovalent or divalent or higher valent aliphatic hydrocarbon. The aromatic hydrocarbon means a hydrocarbon comprising an aromatic ring which may optionally not only comprise an aliphatic hydrocarbon group as a substituent but also be condensed with an alicycle. The aromatic hydrocarbon group means a monovalent or divalent or higher valent aromatic hydrocarbon. These aliphatic hydrocarbon groups and aromatic hydrocarbon groups optionally contain fluorine, oxy, hydroxy, amino, carbonyl, or silyl and the like. Further, the aromatic ring means a hydrocarbon comprising a conjugated unsaturated ring structure, and the alicycle means a hydrocarbon comprising a ring structure but no conjugated unsaturated ring structure.

In the present specification, the alkyl means a group obtained by removing any one hydrogen from a linear or branched, saturated hydrocarbon and includes a linear alkyl and branched alkyl, and the cycloalkyl means a group obtained by removing one hydrogen from a saturated hydrocarbon comprising a cyclic structure and includes a linear or branched alkyl in the cyclic structure as a side chain, if necessary.

In the present specification, the aryl means a group obtained by removing any one hydrogen from an aromatic hydrocarbon. The alkylene means a group obtained by removing any two hydrogen from a linear or branched, saturated hydrocarbon. The arylene means a hydrocarbon group obtained by removing any two hydrogen from an aromatic hydrocarbon.

In the present specification, the description such as "$C_{x-y}$", "$C_x$-$C_y$" and "$C_x$" means the number of carbons in the molecule or substituent group. For example, $C_{1-6}$ alkyl means alkyl having 1 to 6 carbons (such as methyl, ethyl, propyl, butyl, pentyl and hexyl). Further, the fluoroalkyl as used in the present specification refers to one in which one or more hydrogen in alkyl is replaced with fluorine, and the fluoroaryl is one in which one or more hydrogen in aryl are replaced with fluorine.

In the present specification, when a polymer comprises plural types of repeating units, these repeating units copolymerize. These copolymerizations can be any of alternating copolymerization, random copolymerization, block copolymerization, graft copolymerization, or any mixture thereof.

In the present specification, "Wo" represents weight % and "ratio" represents ratio by weight.

In the present specification, Celsius is used as the temperature unit. For example, 20 degrees means 20 degrees Celsius.

<Siliceous Film Forming Composition>

The siliceous film forming composition according to the present invention (hereinafter sometimes referred to as the composition) comprises (a) a certain block copolymer; and (b) a solvent, wherein the content of nitrogen in the block copolymer is 8 to 25 mass % based on the total mass of the block copolymer.

(a) Block Copolymer

The block copolymer used for the present invention (hereinafter sometimes referred to as the block copolymer) comprises:
a linear and/or cyclic block A having a polysilane skeleton comprising 5 or more silicon; and
a block B having a polysilazane skeleton comprising 20 or more silicon,
wherein at least one silicon in the block A and at least one silicon in the block B are connected by a single bond and/or a crosslinking group comprising silicon.

In the present invention, when plural block A or plural block B exist, they can be different structures, respectively. The block A and the block B can be arranged at random or can be alternately arranged. Further, like a graft polymer, for example, one or plural block A can be connected in some places, like a branch, to a block B that serves as a trunk. A plurality of block A can be connected, as side chains, to a main chain comprising the block B.

Furthermore, in one molecule, a block A and a block B, a block A and another block A, or a block B and another block B can be bonded by crosslinking.

In the present invention, the polysilane skeleton refers to a skeleton having a main chain composed only of Si—Si bonds.

In the present invention, the polysilazane skeleton refers to a skeleton having a main chain composed of repeating units of Si—N bond.

Preferably, the block A comprises 5 or more repeating units selected from the group consisting of the following formulae (I-1) to (I-3):

(wherein $R^{Ia}$, $R^{Ib}$ and $R^{Ic}$ are each independently hydrogen, halogen, $C_{1-6}$ alkyl or $C_{6-10}$ aryl), and the block B comprises 20 or more repeating units selected from the group consisting of the following formulae (II-1) to (II-6):

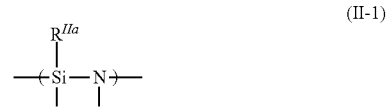

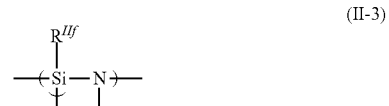

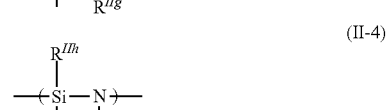

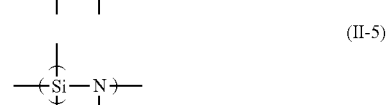

(wherein $R^{IIa}$ to $R^{IIi}$ are each independently hydrogen or $C_{1-4}$ alkyl).

Examples of $R^{Ia}$, $R^{Ib}$ and $R^{Ic}$ in the block A include hydrogen, methyl, ethyl, n-propyl, isopropyl, n-butyl, isobutyl, phenyl, tolyl and xylyl. Preferably, all of $R^{Ia}$, $R^{Ib}$ and $R^{Ic}$ are hydrogen.

Although the combination of the repeating units (I-1), (I-2) and (I-3) is not particularly limited, it is preferable that at least one of (I-2) or (I-3) is contained.

The number of the block A in one molecule is preferably 1 to 95, more preferably 3 to 90.

In the case where the block A is linear, the total number of repeating units of the formulae (I-1) to (I-3) constituting one block A is preferably 5 to 20, more preferably 5 to 15. It is preferable that each repeating unit is directly bonded to form Si—Si bond.

It is preferable that at least one of the block A is one represented by the following formula (I-4):

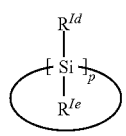

(I-4)

(wherein $R^{Id}$ and $R^{Ie}$ are each independently hydrogen, halogen, $C_{1-6}$ alkyl, $C_{6-10}$ aryl or a single bond, provided that at least one of $R^{Id}$ and $R^{Ie}$ is a single bond, and p is an integer of 5 or more).

Preferably, p is 5 or 6.

Preferably, the above single bond is directly linked to silicon in another block A or the block B.

Preferably, one of $R^{Id}$ and $R^{Ie}$ is a single bond and all of the others are hydrogen.

Examples of $R^{IIa}$ to $R^{IIi}$ in the block B include hydrogen, methyl, ethyl, n-propyl, isopropyl, n-butyl and isobutyl. Preferably, all of $R^{IIa}$ to $R^{IIi}$ are hydrogen.

Although the combination of the repeating units (II-1) to (II-6) is not particularly limited, it is preferable that at least one of (II-3) to (II-6) is contained.

The number of the repeating units in one block B is 20 or more, preferably 20 to 330, more preferably 20 to 130. It is preferable that each repeating unit is directly bonded without intervening any repeating unit other than (II-1) to (II-6).

The number of the block B in one molecule is preferably 1 to 24, more preferably 1 to 6.

The block copolymer used for the present invention preferably further comprises a crosslinking group comprising silicon, which crosslinks the block A each other, the block B each other, or between the block A and the block B.

Examples of the crosslinking group comprising silicon include —$Si_2R_4$— (wherein R is each independently hydrogen, halogen, alkyl or alkoxy, preferably hydrogen or Cl).

Although the combination of the block A and the block B is not particularly limited, the ratio of the total number of the repeating units of formulae (I-1) to (I-3) to that of the repeating units of the formulae (II-1) to (II-6) (in the present invention, sometimes referred to as "repeating unit ratio") is preferably 20 to 230%, more preferably 20 to 200%.

As the method for measuring the repeating unit ratio, for example, in the spectrum obtained by quantitative $^{29}$Si-NMR in accordance with inverse gate decoupling method (in the present invention, sometimes referred to as "$^{29}$Si-NMR"), it can be measured by a ratio of the peak area detected at −95 ppm to −115 ppm with respect to the peak area detected at −25 ppm to −55 ppm.

In the present invention, the measurement of $^{29}$Si-NMR can be specifically carried out as follows.

First, a solvent is removed, using an evaporator, from the block copolymer according to the present invention obtained by synthesis, and 0.4 g of the obtained block copolymer is dissolved in 1.6 g of a deuterated solvent such as deuterated chloroform (manufactured by Kanto Chemical Co., Inc.) to obtain a sample solution. Using a JNM-ECS 400 type nuclear magnetic resonance apparatus (trade name, manufactured by JEOL Ltd.), a $^{29}$Si-NMR spectrum of the sample solution is obtained by measuring 1,000 times. In NMR spectra, a peak assigned to Si containing in a polysilazane skeleton (δ=about −25 to −55 ppm) and a peak assigned to Si containing in a polysilane skeleton (δ=about −95 to ~115 ppm) are recognized.

The content of nitrogen in the block copolymer used for the present invention is 8 to 25 mass %, preferably 8 to 20 mass %, based on the total mass of the block copolymer.

The content of nitrogen can be calculated, for example, from an element ratio obtained by subjecting a film formed from the polymer to elemental analysis by Rutherford backscattering spectroscopy. Specifically, it can be measured as described below. The block copolymer solution comprising the block copolymer solution according to the present invention and the solvent is spin-coated on a 4 inch wafer at a rotation speed of 1,000 rpm using a spin coater (Spin Coater 1HDX2 (trade name), manufactured by Mikasa Co., Ltd.) under a nitrogen atmosphere. The obtained coating film is baked at 240° C. for 10 minutes under a nitrogen atmosphere. The baked film is subjected to elemental analysis by Rutherford backscattering spectrometry using Pelletron 3SDH (trade name, manufactured by National Electrostatics Corporation), whereby an atomic content ratio is measured.

Because of the solubility of the block copolymer in the solvent, the planarization of the block copolymer film and the adhesion to the substrate, the mass average molecular weight of the block copolymer according to the present invention is preferably 1,100 to 25,000, more preferably 2,000 to 20,000, and particularly preferably 2,500 to 10,000. The mass average molecular weight is a mass average molecular weight in terms of polystyrene, and it can be measured by gel permeation chromatography based on polystyrene.

Although the method for producing the block copolymer used for the present invention is not particularly limited, the production method, for example, comprises:

(A) a step of irradiating a cyclic polysilane comprising 5 or more silicon with light;

(B) a step of preparing a mixture comprising the light-irradiated cyclic polysilane comprising 5 or more silicon and a polysilazane comprising 20 or more silicon; and (C) a step of irradiating said mixture with light.

Hereinafter, an example of the production method is described for each step.

(A) Step of irradiating cyclic polysilane comprising 5 or more silicon with light The cyclic polysilane comprising 5 or more silicon (hereinafter sometimes referred to as "cyclic polysilane") used in the production method according to the present invention can be freely selected unless it impairs the effect of the present invention. These are either inorganic compounds or organic compounds and can be linear, branched, or partially having a cyclic structure.

Preferably, the cyclic polysilane is represented by the following formula (I-5):

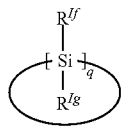
(I-5)

wherein, $R^{If}$ and $R^{Ig}$ are each independently hydrogen, halogen, $C_{1-6}$ alkyl or $C_{6-10}$ aryl, and q is an integer of 5 or more.

Preferably, q is 5 to 8, more preferably 5 or 6.

Examples of the preferred cyclic polysilane include silyl cyclopentasilane, silyl cyclohexasilane, disilyl cyclohexasilane, cyclopentasilane and cyclohexasilane, preferably cyclopentasilane or cyclohexasilane.

The wavelength of irradiation light in the step (A) preferably comprises at least a wavelength of 172 to 405 nm, more preferably 282 to 405 nm. The irradiation intensity is preferably 10 to 250 mW/cm², more preferably 50 to 150 mW/cm², and the irradiation time is preferably 30 to 300 seconds, more preferably 50 to 200 seconds.

Since cyclopentasilane or cyclohexasilane is a liquid at room temperature, light can be irradiated to the cyclic polysilane being in its liquid state while stirring. In addition, when cyclosilane is a solid, it can be dissolved in an appropriate solvent and irradiated with light while stirring.

It is considered that some or all of the cyclic polysilane undergo ring-opening reaction by the light irradiation in this step.

(B) Step of preparing mixture comprising the light-irradiated cyclic polysilane comprising 5 or more silicon and polysilazane comprising 20 or more silicon In this step, a mixture comprising the cyclic polysilane irradiated with light in the step (A) and a polysilazane comprising 20 or more silicon (hereinafter sometimes referred to as "polysilazane") is prepared. It is preferred that the mixture further comprises a crosslinking agent comprising silicon.

The polysilazane used in the production method according to the present invention can be freely selected unless it impairs the effect of the present invention. These are either inorganic compounds or organic compounds, and can be linear, branched, or partially having a cyclic structure.

The polysilazane used in the production method according to the present invention is preferably comprises at least 20 repeating units selected from the group consisting of the following formulae (II-1) to (II-6):

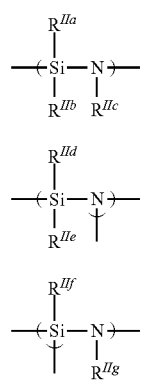
(II-1)

(II-2)

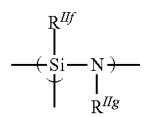
(II-3)

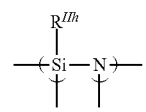
(II-4)

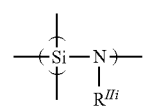
(II-5)

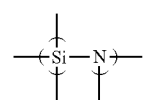
(II-6)

wherein $R^{IIa}$ to $R^{IIi}$ are each independently hydrogen or $C_{1-4}$ alkyl.

More preferably, the polysilazane used in the production method according to the present invention is perhydropolysilazane (hereinafter referred to as "PHPS"). PHPS is a silicon-containing polymer comprising Si—N bonds as repeating units and consisting only of Si, N and H. In this PHPS, except Si—N bond, all elements binding to Si or N are H and any other elements such as carbon or oxygen are not substantially contained. The simplest structure of the perhydropolysilazane is a chain structure having a repeating unit of the following formula:

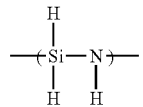

In the present invention, any PHPS having a chain structure and a cyclic structure in the molecule can be used, and examples of the PHPS include those comprising repeating units represented by the following formulae (IIa) to (IIf) and a terminal group represented by the following formula (IIg) in the molecule:

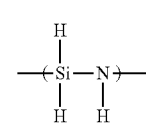
(IIa)

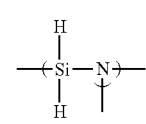
(IIb)

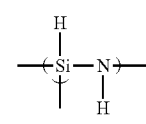
(IIc)

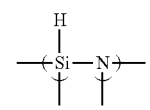
(IId)

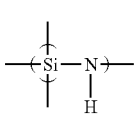

(IIe)

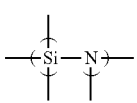

(IIf)

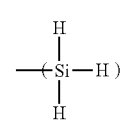

(IIg)

Such a PHPS is one having a branched structure or a cyclic structure in the molecule, and an example of a specific partial structure of such a PHPS is one represented by the following formula:

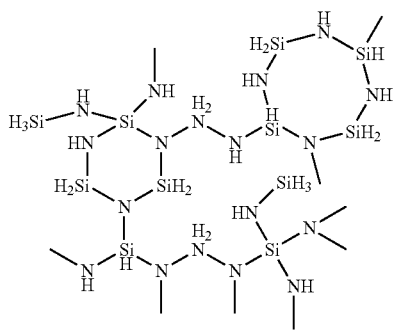

Further, it has or has not a structure represented by the following formula, i.e. a structure wherein plural Si—N molecular chains are crosslinked:

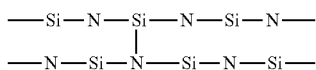

As far as the PHPS according to the present invention comprises Si—N bonds as the repeating unit and is a silicon-containing polymer consisting only of Si, N and H, its structure is not limited, and other various structures exemplified above are possible. For example, it can be one having a structure composed by combining the above-described linear structure, cyclic structure and crosslinked structure. In addition, the PHPS in the present invention is preferably one having a cyclic structure or crosslinked structure, particularly crosslinked structure.

From the viewpoint of the solubility in solvents and the reactivity, the mass average molecular weight of the polysilazane used in the production method according to the present invention is preferably 900 to 15,000, more preferably 900 to 10,000. The mass average molecular weight is a mass average molecular weight in terms of polystyrene, and it can be measured by gel permeation chromatography based on polystyrene.

The crosslinking agent used in the production method of the present invention comprises silicon. This crosslinking agent is preferably bifunctional or higher functional. Examples of such a crosslinking agent include a halogenated silane compound, an alkoxysilane compound, and specifically hexachlorodisilane, 1,1,2,2-tetrachloro-1,2-dimethyldisilane, 1,2-dichlorodisilane, 1,1-dichlorodisilane, 1,2-dichlorotetramethyldisilane, octachlorotrisilane, 1,1,1,3,3,3-hexachloro-2,2-dimethyltrisilane, dichlorosilane, methyldichlorosilane, dichlorodimethylsilane, trichlorosilane, methyltrichlorosilane, hexachlorodisilazane, tetrachlorodisilazane, hexachlorodisiloxane, 1,1,3,3-tetrachloro-1,3-dimethyldisiloxane, 1,3-dichloro-1,1,3,3-tetramethyldisiloxane, 1,3-dichlorodisiloxane, bistrichlorosilylacetylene, 1,2-bistrichlorosilylethene, 1,2-bisdichloromethylsilylethene, trimethoxysilane, methyltrimethoxysilane, methyldimethoxysilane, dimethoxydimethylsilane, triethoxysilane, diethoxysilane, methyldiethoxysilane, diethoxydimethylsilane, and the like.

This crosslinking agent crosslinks a polysilane and a polysilazane, polysilane each other or polysilazane each other. Since the block copolymer that is crosslinked in this way suppresses the phase separation between the block A and the block B, it is considered that forming a uniform film becomes easier at the time of forming a cured film.

The molecular weight of the crosslinking agent used in the production method of the present invention is preferably 100 to 350, more preferably 125 to 270.

(C) Step of irradiating said mixture with light

It is considered that the reaction of polycondensation of the block A and the block B occurs by light irradiation in this step. The wavelength of irradiation light at this time preferably includes at least a wavelength of 172 to 405 nm, more preferably 282 to 405 nm. The irradiation intensity is preferably 10 to 250 mW/cm$^2$, more preferably 50 to 150 mW/cm$^2$, and the irradiation time is preferably 5 to 100 minutes, more preferably 5 to 60 minutes. The irradiation energy is preferably 3 to 1,500 J, more preferably 25 to 500 J.

The above-mentioned steps (A) to (C) are preferably carried out under an inert gas atmosphere.

After the step (C), a solvent such as cyclooctane is added, and byproducts are removed by filtration using a filter to obtain the block polymer used for the present invention. This product is the block copolymer of the invention having two types of blocks.

An exemplified embodiment of the partial structure of the block copolymer is following:

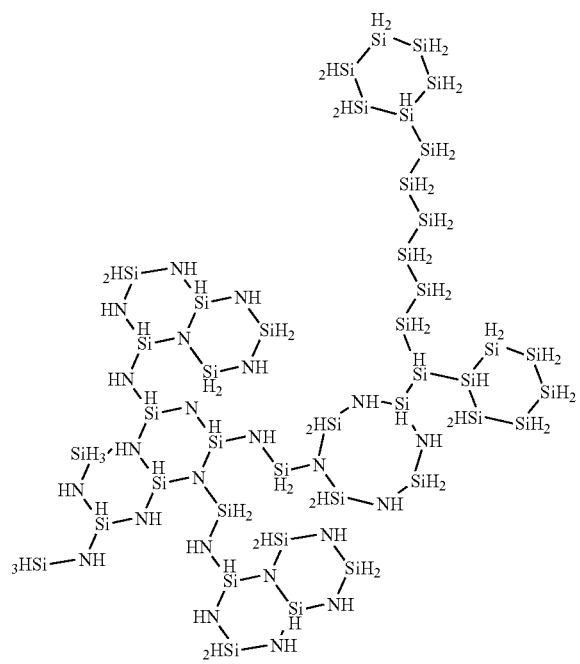

(b) Solvent

The composition according to the present invention comprises a solvent. The solvent is selected from those which uniformly dissolve or disperse each component contained in the composition. Specifically, examples of the solvent include ethylene glycol monoalkyl ethers, such as ethylene glycol monomethyl ether, ethylene glycol monoethyl ether, ethylene glycol monopropyl ether and ethylene glycol monobutyl ether; diethylene glycol dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether (PGME) and propylene glycol monoethyl ether; propylene glycol alkyl ether acetates such as propylene glycol monomethyl ether acetate (PGMEA), propylene glycol monoethyl ether acetate and propylene glycol monopropyl ether acetate; aromatic hydrocarbons, such as benzene, toluene, xylene, ethylbenzene, and mesitylene; ketones, such as methyl ethyl ketone, acetone, methyl amyl ketone, methyl isobutyl ketone and cyclohexanone; alcohols, such as isopropanol and propanediol; pentane, isopentane, hexane, isohexane, heptane, isoheptane, octane, isooctane, nonane, and decane, and alicyclic hydrocarbons, such as cyclohexane, methylcyclohexane, ethylcyclohexane, cycloheptane, cyclooctane and decalin. Preferred are cyclooctane, toluene, decalin and mesitylene.

These solvents may be used alone or in combination of two or more of any of these.

In order to homogeneously dissolve polymer, the relative dielectric constant of the solvent is preferably 3.0 or less, more preferably 2.5 or less on the basis of the value described in "Solvent Handbook, 1st Edition", Kodansha Scientific.

Although the mixing ratio of the solvent varies depending on the coating method and the film thickness after coating, the ratio (solid content ratio) of the compounds other than the solvent is 1 to 96 mass %, and preferably 2 to 60 mass %.

The composition used in the present invention essentially comprises the above-mentioned (a) and (b), but if necessary, further compounds can be combined. The materials which can be combined are described below. The components other than (a) and (b) contained in the whole composition are preferably 10% or less, and more preferably 5% or less, based on the total mass.

(c) Optional Components

In addition, the composition according to the present invention can contain optional components, if needed. Such optional components include, for example, surfactants.

Surfactants are preferably used because they can improve the coating properties. The surfactants which can be used in the siloxane composition of the present invention include nonionic surfactants, anionic surfactants, amphoteric surfactants, and the like.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycols; acetylene alcohol derivatives, such as polyethoxylate of acetylene alcohol; acetylene glycol derivatives, such as polyethoxylate of acetylene glycol; fluorine-containing surfactants, for example, FLUORAD (trade name, manufactured by 3M Japan Limited), MEGAFAC (trade name: manufactured by DIC Cooperation), SURFLON (trade name, manufactured by AGC Inc.); or organosiloxane surfactants, for example, KP341 (trade name, manufactured by Shin-Etsu Chemical Co., Ltd.), and the like. Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexane-diol, and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid, and the like.

Further, examples of the amphoteric surfactant include 2-alkyl-N-carboxymethyl-N-hydroxyethyl imidazolium betaine, lauric acid amide propyl hydroxysulfone betaine, and the like.

These surfactants can be used alone or in combination of two or more of any of these, and the mixing ratio thereof is usually 50 to 10,000 ppm, and preferably 100 to 5,000 ppm, based on the total mass of the composition.

<Method for Producing a Siliceous Film>

The method for producing a siliceous film according to the present invention comprises applying the above mentioned siliceous film forming composition above a substrate to form a coating film and heating the coating film in an oxidizing atmosphere.

The method for coating the composition above a substrate surface can be freely selected from known methods, such as spin coating, dip coating, spray coating, transfer coating, roll coating, bar coating, brush coating, doctor coating, flow coating, slit coating, and the like. Moreover, as a substrate on which the composition is coated, suitable substrates, such as a silicon substrate, a glass substrate, a resin film, can be used. Various semiconductor devices and the like can be formed on these substrates, if necessary. When the substrate is a film, gravure coating can be also used. A drying step can also be provided separately after coating a film if desired. Further, by repeating the coating step once or twice or more as needed, the film thickness of the coating film to be formed can be made as desired.

After forming a coating film of the composition according to the present invention, it is preferred to carry out pre-baking (heating treatment) of the coating film in order to dry the coating film and reduce the residual amount of the solvent. The pre-baking process can be carried out in the air, inert gas such as nitrogen, or oxygen gas, preferably at a temperature of 50 to 400° C., in the case of a hot plate for 10 seconds to 30 minutes and in the case of a clean oven for 1 to 30 minutes. Preferably, the pre-baking process is carried out in nitrogen atmosphere.

After pre-baking process, the coating film is heated in an oxidizing atmosphere if needed. By the heating, the coating film is converted to a siliceous film. In the present specification, "siliceous film" means the ratio of the number of the oxygen atoms to the number of silicon atoms (O/Si) is 1.20 to 2.50, preferably 1.40 to 2.50, more preferably 1.60 to 2.45. "oxidizing atmosphere" means an atmosphere having oxygen partial pressure within the range of 20 to 101.3 kPa, preferably 40 to 101.3 kPa, and more preferably 1.5 to 80 kPa, under total pressure of 101.3 kPa.

Further, it is preferable to heat in an atmosphere containing steam during the heating. The atmosphere containing steam means an atmosphere having a steam partial pressure within the range of 0.5 to 101 kPa, preferably 1 to 90 kPa, more preferably 1.5 to 80 kPa. Heating can be carried out in a temperature range of 200 to 1,200° C.

In case that other element such as an electronic device, which is simultaneously exposed to a heat treatment, is present and if heating is carried out in a steam-containing atmosphere at a high temperature, for example, a temperature exceeding 600° C. There is a concern that the other element is adversely affected in some cases. In such a case, the silica conversion step is divided into three or more stages, and the heating can be carried out, first in an oxidizing temperature of a relatively low temperature, for example, in the temperature range of 200 to 400° C., next in a steam-containing atmosphere of a relatively low temperature, for example, in the temperature range of 300 to 600° C. and then in a steam-free atmosphere of a higher temperature, for example, in a temperature range of 500 to 1,200° C.

Any gas can be used as a constituent other than steam in an atmosphere containing steam (hereinafter referred to as dilution gas), and specific examples thereof include air, oxygen, nitrogen, helium, argon, and the like. It is preferable to use oxygen as the dilution gas in terms of the film quality of the obtained siliceous material. However, the dilution gas is appropriately selected in consideration of the influence on other elements such as electronic devices exposed to the heat treatment. Furthermore, a reduced pressure or a vacuum atmosphere of less than 1.0 kPa may be adopted as the steam-free atmosphere in the above-described three-stage heating system, in addition to the atmosphere containing any of the above dilution gases.

After forming a coating film using the composition according to the present invention, before pre-baking step, light irradiation to the coating film can be further carried out. It is possible to suppress the decrease in film thickness in the curing step by light irradiating to the coating film. The light irradiation is preferably to irradiate light having the wavelength of 248 to 436 nm, and more preferably 282 to 405 nm. The irradiation intensity is preferably 10 to 700 mW/cm$^2$, and more preferably 40 to 500 mW/cm$^2$, and the irradiation time is preferably 30 to 3,000 seconds, and more preferably 50 to 2,500 seconds.

The film thickness of the formed siliceous film is not particularly limited, but preferably 3 to 25 μm, more preferably 3 to 20 μm.

The siliceous film forming composition according to the present invention is characterized by penetrating into narrow trenches and the like easily, and forming an uniform siliceous film even in the inside of trenches. It is preferably applied above a substrate having trench portions and holes of a high aspect ratio. Specifically, it is preferably applied above a substrate having at least one trench having a width of the deepest portion of 0.1 μm or less and an aspect ratio of 2 to 500. The shape of the trench is not particularly limited, and the cross section thereof is any of a rectangle, a forward tapered shape, a reverse tapered shape, a curved surface shape, and the like. Both end portions of the trench may be opened or closed.

The method for producing electronic device according to the present invention comprises above mentioned method.

Hereinafter, the present invention is explained with reference to Examples. These Examples are for explanation and are not intended to limit the scope of the present invention.

In the following description, "part" is on a mass basis unless otherwise specified.

The synthesis of the block copolymer and preparing step of the composition in the following Examples and Comparative Examples were all carried out in a glove box controlled to have an oxygen concentration of 1.0 ppm or less and a dew point temperature of −76.0° C. or less under an inert gas atmosphere.

Example 1

A stirrer tip was placed in a 6 mL screw tube, and 0.35 g (2.03 mmol) of cyclohexasilane was added thereto and stirred using a stirrer. Ultraviolet ray having a wavelength of 365 nm using a mercury xenon lamp as a light source was irradiated through an optical fiber at an irradiation intensity of 82 mW/cm$^2$ for 105 seconds. After the ultraviolet irradiation, 1.12 g (12.41 mmol) of polyperhydrosilazane solution adjusted to 50 mass % with toluene and having a mass average molecular weight of 2,400, and 0.15 g (1.11 mmol) of trichlorosilane as a crosslinking agent were added. While continuing to stir, ultraviolet ray having a wavelength of 365 nm using a mercury xenon lamp as a light source was irradiated through an optical fiber at an irradiation intensity of 82 mW/cm$^2$ for 45 minutes, to form a block copolymer. After the reaction, toluene was added so that the concentration of the block copolymer is 25 mass %, and after stirring for 3 minutes, filtration was carried out using a 5.0 μm PTFE filter and 0.2 μm PTFE filter. The byproducts were removed to obtain a siliceous film forming composition A. The mass average molecular weight of the synthesized block copolymer was 5,160.

The siliceous film forming composition A was coated on a substrate in nitrogen atmosphere using a spin coater (Spin Coater 1HDX2 (trade name), manufactured by Mikasa Co., Ltd.) to form a coating film. Then, 18 J/cm$^2$ of light having 405 nm was irradiated. The obtained coating film was baked on a hotplate at 150° C. for 1 minute in nitrogen. The obtained baked film was heated 250° C. for 30 minutes in oxygen atmosphere (101 kPa), and then 350° C. for 120 minutes in atmosphere containing steam (40 kPa), and then 900° C. for 30 minutes in nitrogen, to obtain a siliceous film. With respect to the film, an absorption due to Si—O at 1085 cm$^{-1}$, 756 cm$^{-1}$, and 460 cm$^{-1}$ was observed from FT-IR, and it was confirmed that the film was siliceous film. O/Si was 2.31 according to the measurement of secondary ion mass spectrometer (SIMS).

Example 2

A stirrer tip was placed in a 20 mL screw tube, and 0.40 g (2.20 mmol) of cyclohexasilane was added thereto and stirred using a stirrer. Ultraviolet ray having a wavelength of 254 nm using a low-pressure mercury lamp as a light source was irradiated through an optical fiber at an irradiation intensity of 12 mW/cm$^2$ for 180 seconds. After the ultraviolet irradiation, 5.45 g (60.51 mmol) of polyperhydrosilazane solution adjusted to 50 mass % with cyclooctane and having a mass average molecular weight of 5,500, and 0.24 g (1.77 mmol) of trichlorosilane as a crosslinking agent were added. While continuing to stir, ultraviolet ray having a wavelength of 254 nm using a low-pressure mercury xenon lamp as a light source was irradiated through an optical fiber at an irradiation intensity of 12 mW/cm$^2$ for 60 minutes, to form a block copolymer. After the reaction, cyclooctane was added so that the concentration of the block copolymer is 25 mass %, and after stirring for 3 minutes, filtration was carried out using a 5.0 μm PTFE filter and 0.2 μm PTFE filter. The byproducts were removed to obtain a siliceous film forming composition B. The mass average molecular weight of the formed block copolymer was 6,180.

The siliceous film forming composition B was treated as in Example 1 to form a siliceous film. O/Si was 2.25.

Example 3

A stirrer tip was placed in a 10 mL screw tube, and 0.73 g (4.2 mmol) of cyclohexasilane was added thereto and stirred using a stirrer. Ultraviolet ray having a wavelength of 254 nm using a low-pressure mercury lamp as a light source was irradiated through an optical fiber at an irradiation intensity of 12 mW/cm$^2$ for 180 seconds. After the ultraviolet irradiation, 0.97 g (10.8 mmol) of polyperhydrosilazane solution adjusted to 50 mass % with toluene and having a mass average molecular weight of 2,400, and 0.31 g (2.3 mmol) of trichlorosilane as a crosslinking agent were added. While continuing to stir, ultraviolet ray having a wavelength of 254 nm using a low-pressure mercury lamp as a light source was irradiated through an optical fiber at an irradiation intensity of 12 mW/cm$^2$ for 60 minutes, to form a block copolymer. After the reaction, toluene was added so that the concentration of the block copolymer is 25 mass %, and after stirring for 3 minutes, filtration was carried out using a 5.0 μm PTFE filter and 0.2 μm PTFE filter. The byproducts were removed to obtain a siliceous film forming composition C. The mass average molecular weight of the formed block copolymer was 5,200.

The siliceous film forming composition C was treated as in Example 1 to form a siliceous film. O/Si was 2.42.

Example 4

The siliceous film forming composition A was treated as in Example 1 to form a siliceous film. On the siliceous film, the siliceous film forming composition A was treated as in Example 1 to form a further siliceous film. Thick siliceous film was obtained. O/Si was 2.32.

Comparative Example 1

A stirrer tip was placed in a 50 mL screw tube, and 0.35 g (2.01 mmol) of cyclohexasilane was added thereto and stirred using a stirrer. Ultraviolet ray having a wavelength of 405 nm using a Super-high pressure mercury lamp as a light source was irradiated through an optical fiber at an irradiation intensity of 60 mW/cm$^2$ for 120 seconds. After the ultraviolet irradiation, 10.8 g (120.2 mmol) of polyperhydrosilazane solution adjusted to 50 mass % with cyclooctane and having a mass average molecular weight of 1,300, and 0.24 g (1.77 mmol) of trichlorosilane as a crosslinking agent were added. While continuing to stir, ultraviolet ray having a wavelength of 405 nm using a Super-high pressure mercury lamp as a light source was irradiated through an optical fiber at an irradiation intensity of 60 mW/cm$^2$ for 60 minutes, to form a block copolymer. After the reaction, cyclooctane was added so that the concentration of the block copolymer is 25 mass %, and after stirring for 3 minutes, filtration was carried out using a 5.0 μm PTFE filter and 0.2 μm PTFE filter. The byproducts were removed to obtain a comparative composition A. The mass average molecular weight of the formed block copolymer was 4,420.

The comparative composition A was treated as in Example 1 to form a siliceous film.

Comparative Example 2

A stirrer tip was placed in a 6 mL screw tube, and 0.22 g (1.24 mmol) of cyclohexasilane was added thereto and stirring was carried out using a stirrer. Ultraviolet ray having a wavelength of 365 nm using a mercury xenon lamp as a light source was irradiated through an optical fiber at an irradiation intensity of 82 mW/cm$^2$ for 105 seconds. After the irradiation, 0.76 g of cyclooctane was added, and ultraviolet ray having a wavelength of 365 nm using a mercury xenon lamp as a light source was irradiated through an optical fiber at an irradiation intensity of 82 mW/cm$^2$ for 45 minutes. Then, filtration was performed using a 5.0 μm PTFE filter and 0.2 μm PTFE filter to obtain a polysilane solution having a mass average molecular weight of 750.

The polysilane solution was coated on a Si substrate in a nitrogen atmosphere using a spin coater to try to form a coating film, but the polysilane solution was not coated to be adhered on the substrate and did not lead to film formation.

Comparative Example 3

A polyperhydrosilazane solution having a mass average molecular weight of 2,520 was obtained according to the method described in JP H01-138108 A.

The polyperhydrosilazane solution was treated as in Example 1 to form a siliceous film.

[Evaluation of Filing Property]

A silicon substrate having a trench structure with a width of 10 nm and a depth of 1,000 nm on the surface was prepared. The above-described siliceous film forming composition was coated on the silicon substrate by spin coating and subjected to the same heat treatment as above to prepare a silicon substrate with a siliceous film. The silicon substrate with a siliceous film was cut perpendicularly to the trench direction and the cross section was observed for the presence or absence of vacancy (void) in the trench by a scanning electron microscope.

A vacancy was not recognized in the siliceous films according to Examples 1 to 4. The trenches were filled excellently.

[Nitrogen Content]

Compositions were coated on a silicon substrate in nitrogen atmosphere using spin coater and the obtained coating films were baked at 240° C. for 10 minutes in nitrogen atmosphere. Element analysis of the baked coating films were done by Rutherford back scattering method using Pelletron 3SDH (trade name, manufactured by National Electrostatics Corporation), to determine their nitrogen content.

[Film Thickness]

The film thickness of the obtained siliceous films were measured by using a reflection spectroscopy film thickness meter (FE-3000 manufactured by Otsuka Electronics Co., Ltd) when film thickness was 2 μm or less, or by removing the siliceous film partially with hydrofluoric solution and using a surface roughness meter (Surfcom Touch 550 manufactured by TOKYO SEIMITSU., CO., LTD.) when film thickness was more than 2 μm. When the surfaces of the films were observed, no cracks were recognized under the above mentioned condition. The obtained results are shown in Table 1.

[Refractive Index]

Refractive index when the obtained siliceous films were irradiated by the light having wavelength 633 nm were measured using a spectroscopic ellipsometer (M-44, manufactured by J. A. Woollam Co., Inc.). The obtained results are shown in Table 1.

[Evaluation of Electrical Properties]

Using the obtained siliceous film which were prepared to have a 0.3 μm film thickness, relative dielectric constant and breakdown electric field were measured. The relative dielectric constant was measured using a mercury probe tool (MCV-530), manufactured by Semilab Inc. The breakdown electric field was measured using SSM495 272A-M100, manufactured by Japan SSM K.K. The electric field when the current density exceeds $1E^{-6}$ (A/cm$^2$) was taken as Fbd (MV/cm).

The obtained results are shown in Table 1.

TABLE 1

| | Nitrogen content (mass %) | Film thickness (μm) | Refractive index | Relative dielectric constant | Fbd (MV/cm) |
|---|---|---|---|---|---|
| Example 1 | 15 | 9 | 1.454 | 3.65 | 7.45 |
| Example 2 | 25 | 5.0 | 1.451 | 3.60 | 7.27 |
| Example 3 | 9 | 11 | 1.456 | 3.60 | 7.26 |
| Example 4 | 15 | 18 | 1.454 | 3.65 | 7.45 |
| Comparative Example 1 | 28 | 1.8 | 1.454 | 3.61 | 6.41 |
| Comparative Example 2 | | | could not coat | | |
| Comparative Example 3 | 31 | 1.2 | 1.450 | 3.53 | 6.79 |

The invention claimed is:

1. A method for producing a siliceous film, comprising:
applying a siliceous film forming composition comprising:
(a) a block copolymer comprising a linear and/or cyclic block A having a polysilane skeleton comprising 5 or more silicon and a block B having a polysilazane skeleton comprising 20 or more silicon, wherein at least one silicon in the block A and at least one silicon in the block B are connected by a single bond and/or a crosslinking group comprising silicon, and
(b) a solvent,
wherein the content of nitrogen in the block copolymer is 8 to 25 mass % based on the total mass of the block copolymer,
onto a substrate to form a coating film,
irradiating light having the wavelength of 248 to 436 nm after formation of the coating film, and
heating the coating film in an oxidizing atmosphere.

2. The method according to claim 1, wherein
the block A comprises 5 or more repeating units selected from the group consisting of the following formulae (I-1) to (I-3):

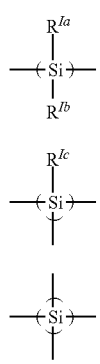

wherein $R^{Ia}$, $R^{Ib}$, and $R^{Ic}$ are each independently hydrogen, halogen, $C_{1-6}$ alkyl or $C_{6-10}$ aryl, and the block B comprises 20 or more repeating units selected from the group consisting of the following formulae (II-1) to (II-6):

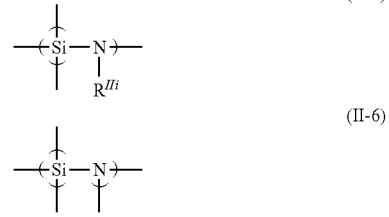

wherein $R^{IIa}$ to $R^{IIi}$ are each independently hydrogen or $C_{1-4}$ alkyl.

3. The method according to claim 1, wherein the mass average molecular weight of the block copolymer is 1,100 to 25,000.

4. The method according to claim 2, wherein all of $R^{Ia}$, $R^{Ib}$ and $R^{Ic}$ in the block A are hydrogen.

5. The method according to claim 2, wherein all of $R^{IIa}$ to $R^{IIi}$ in the block B are hydrogen.

6. The method according to claim 1, wherein the block copolymer comprises a main chain comprising the block B and a side chain comprising the block A.

7. The method according to claim 1, wherein at least one of the block A is represented by the following formula (I-4):

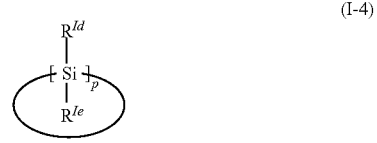

wherein
$R^{Id}$ and $R^{Ie}$ are each independently hydrogen, halogen, $C_{1-6}$ alkyl, $C_{6-10}$ aryl or a single bond, provided that at least one of $R^{Id}$ and $R^{Ie}$ is a single bond, and
p is an integer of 5 or more.

8. The method according to claim 1, wherein between the block A and another block A, between the block B and another block B, or between the block A and the block B in the block copolymer is connected by a crosslinking group comprising silicon.

9. The method according to claim 1, wherein the relative dielectric constant of the solvent is 3.0 or less.

10. The method according to claim 1, wherein the oxidizing atmosphere comprises oxygen at a pressure of 20 to 101 kPa and water vapor at a pressure of 0.5 to 101 kPa.

11. The method according to claim 1, wherein the heating is performed at 200 to 1,000° C.

12. An electronic device, comprising the siliceous film produced by the method according to claim 1.

13. The method according to claim 2, wherein the block A in one molecule is 1 to 95 and the number of the repeating units in one block B is 20 to 330.

14. The method according to claim 2, wherein the block A in one molecule is 3 to 90 and the number of the repeating units in one block B is 20 to 130.

15. The method according to claim 2, wherein the block A is linear, the total number of repeating units of the formulae (I-1) to (I-3) constituting one block A is 5 to 20.

16. The method according to claim 2, wherein the block A is linear, the total number of repeating units of the formulae (I-1) to (I-3) constituting one block A is 5 to 15.

17. The method according to claim 1, wherein the content of nitrogen in the block copolymer is 8 to 25 mass % based on the total mass of the block copolymer.

* * * * *